(12) United States Patent
Hubel

(10) Patent No.: US 6,926,813 B2
(45) Date of Patent: Aug. 9, 2005

(54) ELECTRICAL CONTACTING ELEMENT MADE OF AN ELASTIC MATERIAL

(75) Inventor: Egon Hubel, Feucht (DE)

(73) Assignee: Atotech Deuschland GmbH, Berlin (DE)

( * ) Notice: Subject to any disclaimer, the term of this patent is extended or adjusted under 35 U.S.C. 154(b) by 0 days.

(21) Appl. No.: 10/257,106

(22) PCT Filed: Mar. 30, 2001

(86) PCT No.: PCT/DE01/01355
§ 371 (c)(1),
(2), (4) Date: Oct. 9, 2002

(87) PCT Pub. No.: WO01/81659
PCT Pub. Date: Nov. 1, 2001

(65) Prior Publication Data
US 2003/0121790 A1 Jul. 3, 2003

(30) Foreign Application Priority Data
Apr. 20, 2000 (DE) .......... 100 19 720

(51) Int. Cl.⁷ .......... C25D 17/06
(52) U.S. Cl. .......... 204/297.01; 205/96; 204/297.1; 204/297.14
(58) Field of Search .......... 205/80, 118, 96; 204/198, 227, 297.01, 297.14, 297.1, 5

(56) References Cited

U.S. PATENT DOCUMENTS

| | | | |
|---|---|---|---|
| 1,773,042 A | | 8/1930 | Jones .......... 204/297.16 |
| 3,525,681 A | * | 8/1970 | Rapids .......... 204/224 R |
| 3,649,954 A | * | 3/1972 | Kurtz .......... 439/437 |
| 4,014,778 A | * | 3/1977 | Harrison .......... 204/297.1 |
| 4,100,054 A | | 7/1978 | DuRocher .......... 204/285 |
| 4,155,815 A | | 5/1979 | Francis .......... 204/198 |
| 4,158,612 A | * | 6/1979 | Luch et al. .......... 205/67 |
| 4,389,289 A | * | 6/1983 | deNora .......... 205/511 |
| 5,324,565 A | * | 6/1994 | Leonida et al. .......... 428/131 |
| 6,627,052 B2 | * | 9/2003 | Fluegel et al. .......... 204/224 R |
| 2003/0051999 A1 | * | 3/2003 | Hubel .......... 204/297.01 |

FOREIGN PATENT DOCUMENTS

| | | |
|---|---|---|
| DE | 25 45 906 | 4/1776 |
| DE | WP 71920 | 12/1968 |
| DE | 3612220 A1 | 10/1987 |
| EP | 0 254 962 B1 | 12/1991 |
| JP | 01-127694 * | 5/1989 |
| WO | WO 97/08366 | 3/1997 |
| WO | WO 00/11679 | 3/2000 |

OTHER PUBLICATIONS

SU 1 650 790 A (VNII ELMASH) May 23, 1991, Derwent Productions Ltd. London, GB. XP002175713.
XP002175714, Derwent Publications Ltd. London, GB, Aug. 12, 1976.

* cited by examiner

Primary Examiner—John J. Zimmerman
(74) Attorney, Agent, or Firm—Paul & Paul

(57) ABSTRACT

To electrically contact and electrolytically treat, more specifically to electroplate, very thin, electrically conductive layers, especially with a high electrolytic current, a device comprising contact carriers, more specifically clamps, clips and like, with contact elements for supplying the current to the work is utilized, and at least the contact areas of the contact elements that may be brought to contact the work are made from an elastic, electrically conductive material.

24 Claims, 3 Drawing Sheets

A-A

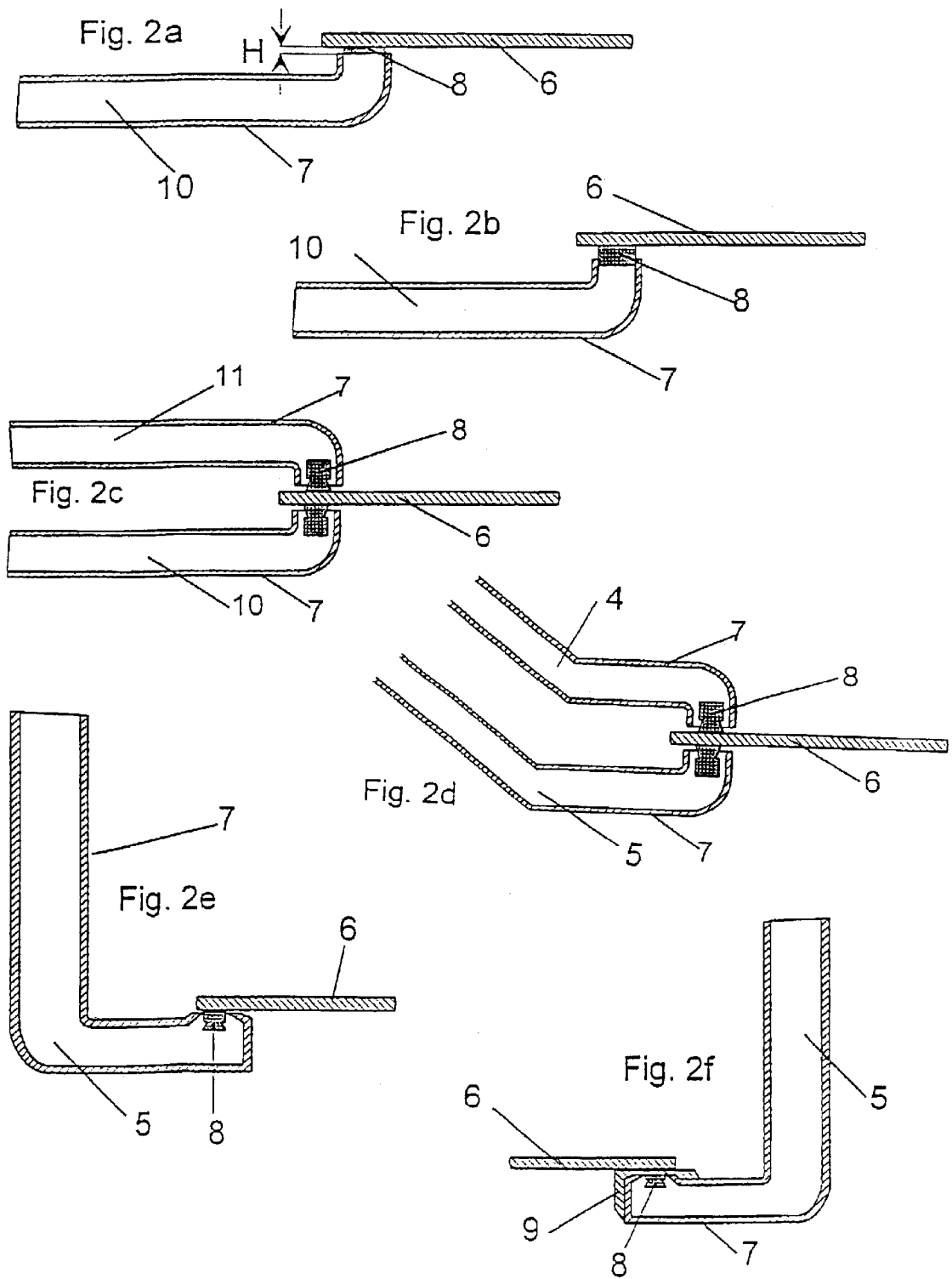

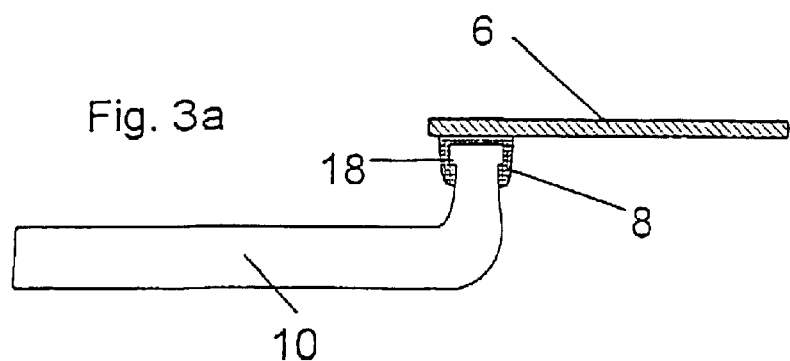
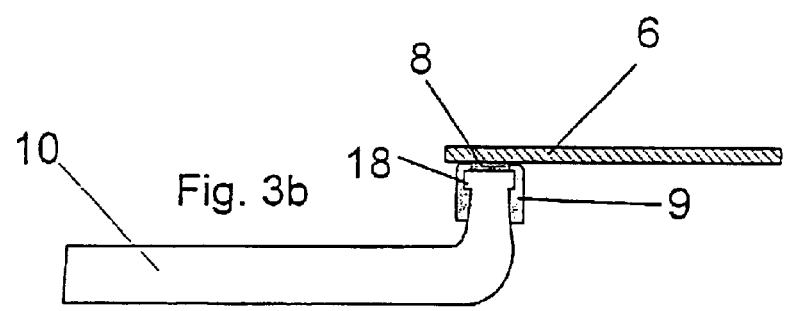
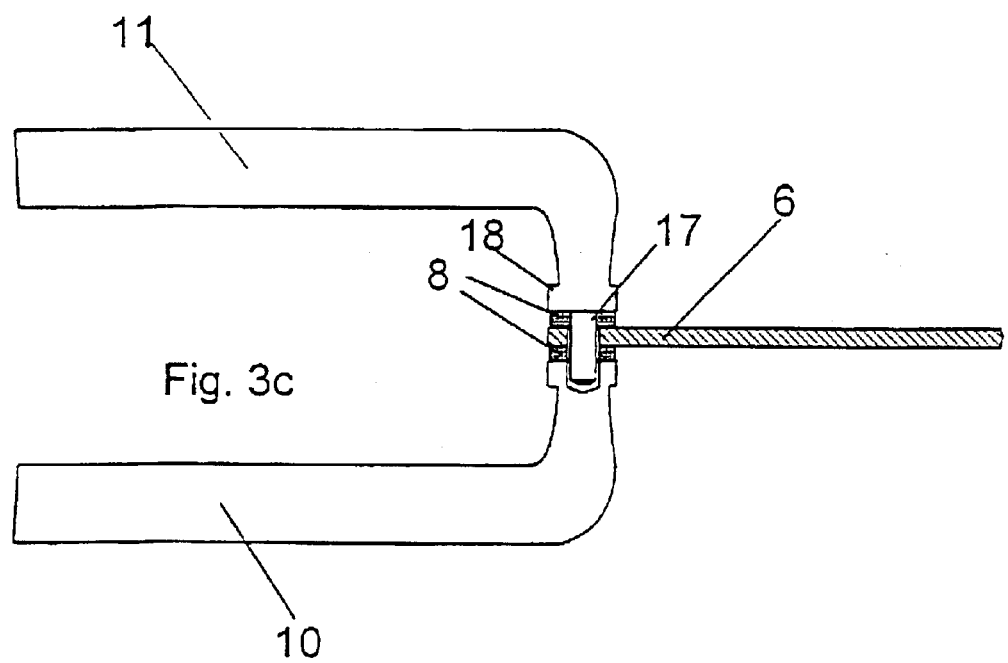

ELECTRICAL CONTACTING ELEMENT MADE OF AN ELASTIC MATERIAL

BACKGROUND OF THE INVENTION

The invention relates to a device and to a method for contacting work that is to be subjected to electrolytic treatment, more specifically work to be electroplated, in electrolytic processes. This method includes but is not limited to electrolytic plating and electrolytic etching of printed circuit boards.

The surface of the work to be electrolytically treated is electrically conductive. The surface of work which is made within of an electrically non-conductive material is usually only provided with a very thin metal layer that is highly sensitive to mechanical stresses and is electrolytically treated. During electroplating, said surface is cathodically polarized, i.e., the surface is connected to the negative pole of a direct current source. Accordingly, the counter electrode, an anode in this case, is connected to the positive pole so as to be electrically conductive. For electrolytic etching, the polarities are inverted. The work is then under anodic polarization.

Current is supplied to the work in varied manners. In dip tanks, so-called racks or rotating clamp-racks are being used. The work is usually retained by springable and electrically conductive contact bows, attachment screws or wires which also serve to supply the current. The racks are adapted to the work.

For fastening board-shaped work to a flight bar, clamps are used as well. Clamps made from metal are widely used in the printed circuit board technique in particular. They are arranged in one row, several centimeters apart, on the flight bar. To place the work on the rack, the clamps are opened. They grasp the boards by way of a spring and carry them during wet-chemical treatment. Concurrently, the clamps serve to supply the current.

In continuous processing plants, more specifically in the printed circuit board technique, the current is also, i.a., introduced into the printed circuit board by means of clamps. Concurrently, the clamps serve to convey the printed circuit boards through the continuous processing plant.

DE 36 12 220 C2 describes a clamp for clampingly holding boards or board-shaped parts such as printed circuit boards for electroplating them in dip tanks. In this document, the clamp is called holding tongs. Clamping projections provided on the holding tongs are placed against the surface of the work for electrical contact.

EP-A 0 254 962 shows, i.a., a clamp for holding printed circuit boards for treatment in a horizontal continuous processing plant. In this case as well, clamping jaws are placed against the printed circuit board. The contact areas of the clamping jaws in this case not acute but plane.

Furthermore, DE-OS 25 45 906 discloses a holding device for parts to be coated in electroplating baths. The device comprises a metal frame and an impervious outer sheath that covers the frame except for at least portion of the frame that remains bare so that electrical contact is possible between the part to be retained by the holding device and a contact member that encompasses the uncovered part. The contact member is made of a non-conductive, resiliently compressible supporting mass containing conductive particles. The mass is electrically non-conductive when it is not compressed. Electrical conductivity is only obtained when the material is compressed by attaching the parts to be treated.

DD-WP 71920 mentions a suspension device for work to be electrolytically treated that is provided with a coating made from silicone resin containing a certain metallic powder in high proportion. In said document, this embodiment is considered disadvantageous as the coating is complicated and expensive to manufacture and only lasts a short time in industrial utilization so that it often needs to be renewed.

The fine line printed circuit board technique requires increasingly thin layers of copper laminate. The purpose thereof is that, after electroplating the printed circuit boards, the fine circuit traces are prevented from being undercut in the subsequent etching procedure. Therefore, copper base layers of e.g., only 5 $\mu$m thick are used. In the SBU printed circuit board technique (SBU: Sequential Build Up), the layers to be electrolytically strengthened have a thickness of less than 1 $\mu$m. In the existing plants, the current intensity in the clamp ranges from 20 A to 50 A on each side of the printed circuit board. The use of the reverse pulse current technique renders the process more difficult. At a metal deposition speed which may be compared to that in use in the direct current technique, the effective output to be transmitted through each contact is still about 25% higher because of the metal dissolving reverse current. Under such extreme requirements, the known clamp contacts fail. This applies to the printed circuit board technique in both dip tanks and continuous processing plants. It also applies to the electroplating of other plastic parts by means of racks in dip tanks under comparable conditions.

The object of the present invention is therefore to overcome the disadvantages of the known methods and devices and more specifically to allow very thin, electrically conductive layers to be electrically contacted and electrolytically treated, particularly with high electrolytic current. This also includes the object to treat thin, conductive layers according to the so-called direct metallization method.

The solution to this object is achieved by the device and the method below. Advantageous developments of the invention are recited in the subordinate claims.

The device and the method in accordance with the invention serve to place electrolytically to be treated work in electric contact. For making electric contact, the device comprises contact carriers with contact elements for supplying the current to the work, more specifically to the work to be electroplated. According to the invention, at least the contact areas of the contact elements that can be placed in electric contact with the work are made from an elastic material that must moreover be electrically conductive. Clamps, tongs, clips, bows and springs with one or two mobile legs are suited as contact carriers in the first place. Mechanical tolerances in the contact elements which are lying plane on the work are compensated through electrically conductive surfaces made from the elastic material in such a manner that electrolytic treatment current, more specifically electroplating current, is transmitted over the entire area of the contact element.

With a device for clamping and electrically contacting the work with the elastic contact material which, at the same time, is provided with very good conductive properties, the mechanical tolerances always encountered in actually plane-parallel planar contact elements are completely compensated when the work is being grasped by means of the clamps, clips and so on mentioned. Deformations of the work such as outward deflections on printed circuit boards or curvatures on molded goods are compensated as well. The closing pressure, and accordingly the pressure necessary to deform the elastic contact material in such a manner that the tolerances are compensated, can be generally provided by a spring. In contrast to known contacting facilities, the device in accordance with the invention moreover permits to reliably prevent the surface of the work from being mechanically damaged thanks to the large engaging area or to the many engaging points. Surprisingly, current transfer is thus ensured in all cases without any problem.

With the device described in DE 36 12 220 C2, by contrast, sensitive layers on the surface of work to be electroplated may easily be damaged. As a result thereof, the conductive layer on the surface is interrupted which causes the current conducted from the clamp to the work to be hindered, or altogether interrupted. If, moreover, boards of varied thickness are treated with the known device and are retained by the holding tongs for this purpose, the projections provided on the holding tongs possibly do not all touch the surfaces of the board in the same way so that in this case, the electric contact in which the board is placed is insufficient. Only if the work has a thickness adapted to given holding tongs, the four clamping projections will all rest in the same proper way on the surface of the board. This is also the case when, with other thicknesses, two respective clamping projections are allowed to dig in the surface. In this case, the surface is damaged and in case of thin electrically conductive surface layers like foils e.g., they can no longer be reliably placed in electric contact as a result thereof. Under these conditions, high electroplating currents will burn the contact points.

EP-A 0 254 962 claims to obviate the problems mentioned by providing a parallel guidance consisting of a driver pin and grooves which is intended to allow placement of the contacts against the entire surface. In practical operation however, this proved impossible because of the technically necessary clearance in the driver pin and of the process tolerances always encountered. At best, the clamping jaws will touch the work on a line, in fact only on one corner of their contact areas. A spacing due to tolerance between the contact area and the surface of the printed circuit board sized in the micrometer range already suffices to contribute no longer to the transfer of the high current required. Accordingly, the current density and, as a result thereof, the voltage drop on the contact resistance and the power loss on the small contact-making corner are extremely high. The contact point is hence strongly heated. If the electrically conductive layer on the surface of the work is thick enough, this heat can be dissipated. With printed circuit boards having the usual copper layers of 17 $\mu$m thick provided on the insulating laminates, this is still possible. In exceptional cases however, a burn through at the clamp may already occur at this layer thickness.

The afore mentioned drawbacks of the known devices are not encountered when using the device in accordance with the invention. Even materials with very thin electrically conductive layers can be treated with high current density without damage being caused to the layers.

In case of very thin electrically conductive layers that are to be electrolytically strengthened, it is advantageous when the transition line of the current supplying contact element between the edge of the contact and the work is particularly large. Accordingly, if a round contact element has a large circumference or if an oblong contact element is particularly long, a large current can be transmitted. The same is achieved when a multitude of points of a contact area reliably touch and thus contact the surface of the work. Again, this is only possible using an inherently elastic contact material. The current density in the contact element and in the region of the surrounding surface of the work is then within the permissible range. As a result thereof, burns are avoided when electric contact is being made. In case of large contact elements, mechanical tolerances however have a particularly great influence because of the large area of contact. Without using the contact element of the invention, only fractions of the area of the metallic contact would rest on the surface of the work so that current would be introduced into the work, entailing all of the above described drawbacks. These tolerances in the micrometer range also include the irregularities of the contact surfaces. Even if rigid contacts of large dimensions are resting in a plane-parallel manner, these irregularities prevent the current from being distributed evenly over the entire metallic contact area when the contact element of the invention is not being used.

SUMMARY OF THE INVENTION

Therefore, the invention is particularly advantageous when used with contact elements provided with large areas. When the work is arranged on racks, said work is pressed against a flat abutment by means of a spring for example. To supply the current to the work, the contact carriers, contact bows for example, are arranged together with the contact elements on racks serving to hold the work, at least one resiliently attached contact carrier and at least one rigidly attached contact carrier for retaining the work, more specifically board-shaped work, being provided. Via a contact element, the resiliently attached contact carrier presses the work against a second contact element provided on the rigidly attached contact carrier for electric contact.

The abutment on the work holding fixture described herein above is advantageously provided with the elastic contact material as well. In all of the cases, the contact is reliably made in an ideal manner thanks to the elastic contact material. Tolerances of the plane-parallelity of contact elements and abutments and outward deflections and other irregularities of the work are compensated to a great extent, which is also the case with the surface irregularities of the very contact element. The clamps, clips and other contact carriers as well as the contact elements may thus be manufactured with less precision. This permits to substantially reduce the cost. The hardness of the elastic contact material ranges from 10 to 70 Shore A according to German DIN 53 505.

Suited elastic contact materials are composite materials consisting of metal and plastic, more specifically composite materials made of an elastic plastic containing electrically conductive fillers in high proportion. They consist of elastomers such as caoutchouc, silicone or other elastic plastics that are electrochemically stable. These also include conductive adhesives that are not completely curing as they are used in the electronics industry. During manufacturing, an electrically conductive filler is added to such materials. This is how the metal-plastic composite is obtained.

The fillers, also called inclusion components, preferably consist in this case of application of metal in the form of powder, fibers, needles, cylinders, spheres, flakes, felt and other forms. The dimensions of these fillers range from the nanometer range to approximately 100 micrometers. The diameter and length of the fiber lengths range from several nanometers to several millimeters. The share of filler in the overall contact material amounts to up to 90 percent by weight. As the share of filler increases, the elasticity of the metal-plastic composite diminishes and the electric conductivity increases. The two values are adapted to the respective case of application. All of the electrochemically stable materials that are electrically conductive at the same time are suited for use as fillers. Usual fillers are e.g., titanium, niobium, platinum, gold, silver, stainless steel and electrocoal. Platinum-plated or gold-plated particles such as spheres made from titanium, copper, aluminum or glass for example may also be used.

In making a metal-plastic composite, a light material such as glass, aluminum or titanium is advantageous. The necessary electric conductivity of the comparably light particles is obtained by electrolytic plating with platinum, gold or silver for example. If the titanium or aluminum particles were not coated, the metal oxidation would prevent very good electric conductivity. Metallic hollow spheres are most advantageous. They have good conducting properties and are of light weight.

Spheres with a diameter of 0.2 mm and less can be manufactured. The wall thickness is optional. It is on the order of 10 micrometers for example. Accordingly, the filler obtained has a specific weight that can be accurately adjusted to the specific weight of the elastic material in selecting the dimensions of the spheres more specifically the wall thickness of the spheres. As a result thereof, no segregation takes place when manufacturing the metal-plastic composite. The composite is perfectly homogeneous.

During the manufacturing of the metal-plastic composite, the light fillers do not tend to segregate during curing. The composite remains very homogeneous so that the electric conductivity is always high enough. The same good results are obtained with filler particles of very small dimensions, with so-called nanostructured composites. Metal fibers or metal flakes also occasion but a slight segregation when manufacturing the elastic and electrically conductive material, that is to say that they also permit to obtain a homogeneous metal-plastic composite. Homogeneity enhances the durability of these elastic electric conductors. The entire section of the conductor is subjected to the same current density. Local overheating does not occur.

The electric conductivity of the elastic contact material that can be achieved with these fillers amounts to $10^{-3}$ $\Omega$cm and in specific cases even to $10^{-4}$ $\Omega$cm. This represents a conductivity which is only ten times less than the conductivity of metals like titanium that can be used for electrolytic processes.

Because of this slightly reduced conductivity of the elastic contact material, the voltage drop is accordingly higher when the current flows through this material. As a result thereof, the contacts are more heated than conventional massive metallic contacts. Therefore, the clamps, tongs, clips, bows and springs are preferably configured in such a manner that only the foremost part of the areas touching the work is covered with the elastic material. This means that the height chosen for the elastic contact element is small and amounts for example to one or two millimeters. As a result thereof, all the actually occurring tolerances are reliably compensated.

The increase in current transfer capacity which is obtained, on the other hand, by a contact element with an ideal touching surface and, hence, by an ideal electric contact, is much greater, with contact elements of large dimensions in particular, related to the transition line about a conventional metal contact as described herein above. In practice, the additional increase in temperature due to the little conductive elastic contact material lies within the permissible tolerance all the more so as the overall heat load per area unit is smaller than with metal contacts with a poor touching surface. Moreover, a major part of the heat energy can be dissipated into the holding members of the contact elements (clamps, rack pole).

The coefficient of friction of the elastic contact material is about three times as great as that of the known metal contacts, which is advantageous. More specifically in the vertical technique, the work, which is in parts very heavy, is better secured thanks to the higher coefficient of friction. This prevents the work from falling out of the rack during transport or when the flight bar fixture is being jolted.

To prevent the work from falling out, metal contact carriers are known which are provided, on their contacting side, with a shoulder in such a manner that a pin engages through a hole of the work into the mating contact carrier, virtually suspending the latter. Contact carriers configured in this way can be combined with the elastic and electrically conductive contact material in accordance with the invention for good concurrent current transfer. To this purpose, the contact carriers are provided with at least two supporting arms, the one supporting arm being provided, in the contacting area, with a pin and the other supporting arm having, in the contacting area, a hole into which the pin can penetrate when making electric contact between the contact elements and the work (see FIG. 3c in this connection).

The use of contact preforms as contact elements, said contact preforms consisting of fine-wired metal wool or suited metallic fabric serving as springable conductive material which is elastic, electrically conductive and thermically stable and provided or not with a plastic composite (plastic filling), yielded good results. In metal fabric providing a registration fit, the filler can be dispensed with either completely or in parts.

The contact carriers provided with the contact elements can be manufactured in varied embodiments:

An elastic, electrically conductive contact element can be positively press-fitted into the contact carriers for example. This ensures easy replacement of the contact elements.

In another embodiment, the elastic, electrically conductive material can also be integrated in the material so that it is tightly adherent and connected to the contact carrier in such a manner that it is electrically conductive; this can be achieved by vulcanization, by bonding by means of an electrically conductive adhesive or by spraying. The advantage of these embodiments is that they are very stable to mechanical loads and to chemical attack by the processing fluids.

Furthermore, the elastic, electrically conductive material can also be fastened to the contact carriers by other joining techniques that do not affect the elasticity of the contact elements.

More specifically, the elastic contact element can be configured in such a manner that it is provided with a high electric conductivity substantially only in the region of the contact areas. It is thus made certain that no metal deposits on the contact elements when carrying out electrolytic metal-plating methods. On the contrary, the contact elements are shielded from the electrical field.

BRIEF DESCRIPTION OF THE DRAWINGS

The Figs. indicated herein after serve to further explain the invention.

FIGS. 2a–2f are side views of exemplary embodiments of elastic contact elements according to the invention mounted on the racks or clamps, the clamp or the rack being provided with an electrically non-conductive protective coating in an effort to prevent metal from undesirably depositing on the clamp body or on the body of the rack;

FIGS. 3a–3c are details of racks or clamps, the body of which is made of blank, conductive material; here, diaphragm facilities are needed in the electroplating bath to prevent unwanted metal deposition.

DESCRIPTION OF THE PREFERRED EMBODIMENTS

Figure 1A:
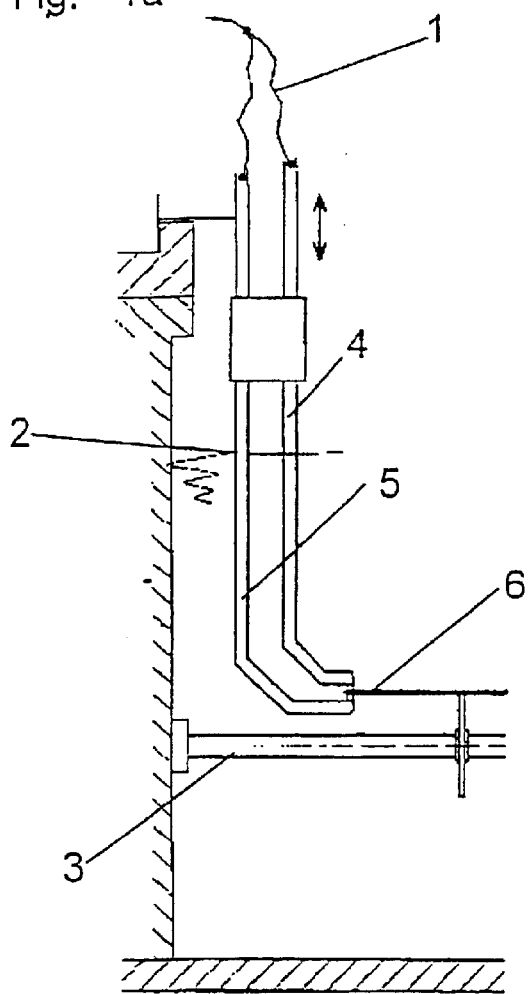
FIGS. 1a, 1b is a side view of an example of the structure of a holding and contacting clamp as well as of a work holding fixture in horizontal (FIG. 1a) and in vertical processing plants (FIG. 1b), more specifically in electroplating plants.
Figure 1B:
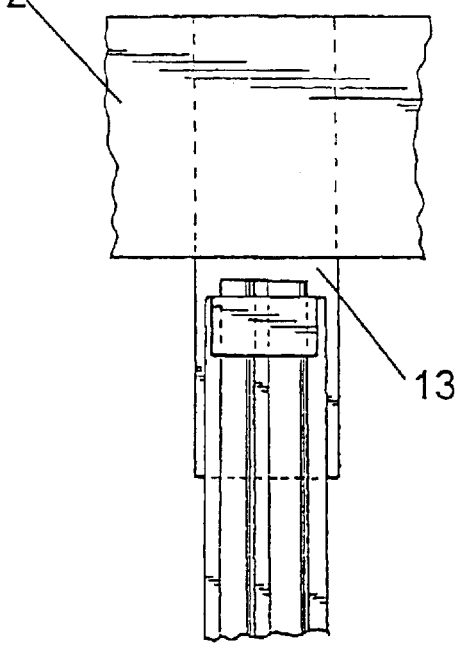
Figure 1C:
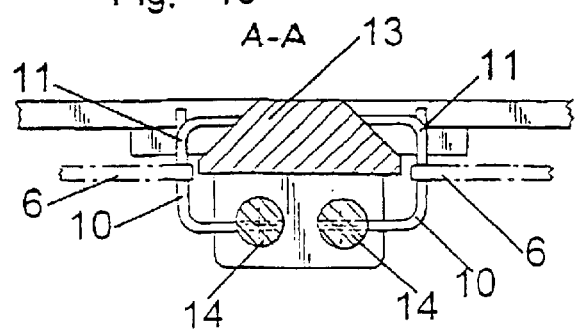
FIG. 1c is a top sectional view of an electroplating rack along A—A of FIG. 1b.
Figure 1C:
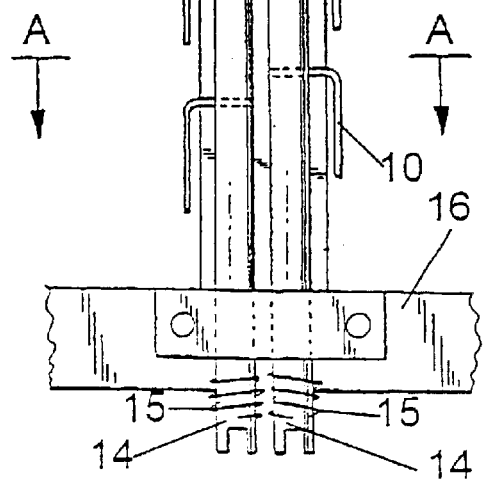

The FIGS. 1a–1c illustrate the general structure of holding and contacting facilities for work, more specifically for work to be electroplated. Accordingly, these Figs. concurrently represent the general structure of known facilities for holding work and for placing said work in electric contact, when they are not provided with the contact elements of the invention made of elastic, electrically conductive material.

FIG. 1a is a side view of an example of a clamp facility usually used for electroplating in horizontal continuous processing plants. By way of sliding contacts not illustrated herein, electric supply lines 1 connect the clamp facility to the electroplating current source (neither shown). The clamp, which consists of a stationary clamp arm 5 and of a spring mounted arm 4 is fastened by the stationary part 5 to a strap or a chain and endlessly revolves on a predetermined trajectory. At the beginning of the processing line in the continuous processing plant, after the work 6 (printed circuit boards in this case) are charged into the plant, the clamp part 4 is closed by way of suited facilities through a spring, which is not illustrated herein, and retained. Metallic, blank contact areas which transmit the electroplating current onto the work 6 are arranged on the front portions of the clamp parts 4 and 5. The clamp parts 4, 5 are immersed into the bath fluid together with the work 6. In this example, the fluid reaches the line indicated at 2. Axles 3 with support wheels are incorporated into the electroplating facility for further support and for transport of the work 6.

FIGS. 1b and 1c show an example of a rack for electroplating printed circuit boards in vertical electroplating plants. The rack carrier 12, a detail of which is illustrated herein and on which the various rotating clamp-carriers 13 are fastened in such a manner that they vertically project into the bath, extends over the whole width of an electroplating bath. The clamp bows 11 of the rack (not shown in FIG. 1b) are rigidly connected to the rotating clamp-carrier 13. On their side facing the work 6, the clamp bows 11 of the rack are provided with a contact area for holding the work and for supplying the current, said contact area being configured, in the known devices, as a non elastic metal surface. If this device is configured in accordance with the invention, the contact area of the clamp bow 11 of the rack is formed with an elastic, electrically conductive material. A supporting frame 16, which serves to stabilize the rotating clamp-carriers 13 that project up to 2 meters downward into a processing tank, is provided beneath the racks. In this example two rotatably carried bars 14 are fastened to the rotating clamp-carrier 13 by means of clamp bows 10 of the rack, so that work 6 can be attached to the left and to the right side of the carrier 13. In case the rack is configured in a conventional manner, rigid metal areas serving as contact areas are provided on the bows 10. In the case of an embodiment in accordance with the invention, an elastic, electrically conductive contact element is provided there.

The work 6, which is not illustrated in FIG. 1b, is fastened by clamping by means of springs 15. After treatment, the rotating clamp-bars 14 are rotated against the pressure of the spring with devices not illustrated herein, and the rack is thus opened. In this position, the work 6 can be removed from the rack, either by hand or by means of other handling means such as a robot for example. As a result thereof, the racks are very well suited for automatic placement.

The embodiments of the contact devices of the invention presented herein after can be provided in the devices shown in the FIGS. 1a–1c. Inasmuch as only one single contact carrier of the respective contact device is shown in the FIGS. 2a–2f, an additional contact carrier may be provided in order to retain the work to be electroplated by wedging it for example. The second contact carrier not shown can be provided with a contact element of the invention in just the same way as the contact carrier represented, the contact elements provided on the two contact carriers being preferably arranged in such a manner that they are directly facing each other in order to fasten the work to be electroplated by wedging it between the two of them.

FIG. 2a shows a detail of the front portion of the clamp bow 10 on a rotating clamp-bar that is not illustrated herein. The clamp bow 10 is provided with a non conductive plastic insulation 7. The clamp bow 10 is thus prevented from being electrolytically treated by being contacted with the processing fluid. Furthermore, the rack thus acts as a thief cathode with regard to the work 6. Through the action of such a thief cathode the layer thickness in the areas surrounding the clamp bows 10 of the rack would be reduced when carrying out electroplating methods. Usually, the insulation consists of a plastic such as Halar®. The elastic contact element 8 in accordance with the invention is bonded, sprayed or vulcanized onto the blank tip of the clamp bow 10 in such a manner that it is electrically conductive. The identically configured clamp bow 11, which is not illustrated herein, is arranged directly opposite. Said clamp bow 11 is also provided with an elastic contact element 8 so that secure and uniform transfer of current is made certain of on either side of the work. The elasticity and the height H of the contact element 8 are chosen so that all the irregularities on the rack and on the work 6 due to tolerances can be compensated.

FIG. 2b and FIG. 2c show further clamp bows 10, 11 of the rack, in which the elastic contact elements 8 are realized in another form. In FIG. 2b, the contact element 8 is laterally embedded into the insulation 7 in order to prevent as far as possible metal from depositing there.

In FIG. 2c, the elastic contact element 8 shown is shaped like a mushroom, which allows it to be retained in the clamp bows of the rack. In this case, it needs not be bonded or vulcanized. A particular advantage of this embodiment is that the contact element 8 is easy to replace in case of damage or wear. It may also be screwed or joined by any other joining technique that does not affect the elasticity of the contact elements 8 and of the abutments.

FIG. 2d shows a pair of clamps that grasp the work 6 by means of the clamp part 5 which is rigidly attached to the transport means (not shown) and of the mobile clamp part 4. A spring which is not illustrated herein thereby presses the upper portion of the clamp 4 against the lower portion of the clamp 5. The elastic conductive contact elements 8 are pressed into corresponding bores on the curved ends of the clamp portions 4, 5. In this case too, it is made certain that the elastic contact elements 8 can be readily replaced.

FIG. 2e shows a stationary clamp portion 5 with the work 6, the elastic contact element 8 being shaped like a mushroom to provide a particularly strong hold in the clamp portion 5 while allowing for easy replacement of the contact element 8.

As compared to FIG. 2e, FIG. 2f shows an additional elastic sheathing 9 in the region about the elastic, electrically conductive clamping contact element 8. When the clamp grasps, the elastic, non-conductive coating 9 is compressed together with the conductive contact element 8 thus providing secure hold for the work 6. The purpose thereof is to embed the conductive contact element 8 in such a manner that unwanted metal does not deposit on the edge of the conductive contact element 8 while the work is being metal-plated. Such metal layers would have to be removed prior to another grasping procedure of the clamp and the clamp would have to be cleaned in order to restore the elasticity needed for the contact element 8.

FIGS. 3a–3c further show non insulated clamp bows 10, 11. Here, the electrical field is shielded from the contact carriers 10, 11 by other means such as diaphragms for example, which are arranged in the bath. Alternatively, the work 6 may also be contacted above the level of the bath.

In the case of FIG. 3a the elastic, electrically conductive contact element 8 is pulled over the clamp bow 10 of the rack and blocked behind the projection 18.

FIG. 3b shows an electrically conductive contact element 8 that is bonded or vulcanized and sheathed with a non conductive, elastic insulating layer 9 in order to prevent unwanted metal deposits in regions directly surrounding the elastic, conductive contact element 8. The electrically insulating sheathing 9 and the contact element 8 advantageously consist of a unit with varied electric conductivity. Said unit is for example pulled over the clamp bow 10.

FIG. 3c shows a stationary clamp bow 10 and a mobile clamp bow 11 together with the elastic contact elements 8 and the work 6. Furthermore, a pin 17 is arranged on the stationary clamp bow 11, said pin projecting into the bore provided on the mobile clamp bow 10 in the closed condition. The pin 17 engages through a corresponding bore in the work 6 and blocks it tightly, providing a registration fit. The elastic contact elements 8 compensate the tolerances in this case as well. No high demands are placed on the precision of the pin.

All of the examples of the elastic, conductive contact elements can be realized in rotational symmetry or be elongate extending into the plane of the drawing and, oval or rectangular for example. For use in the printed circuit board technique, the base of an oblong contact element can for example amount to 40 times 2 millimeters.

The elastic contact element can be made by stamping, cutting, spray molding, extrusion or metal wire weaving for example. The contact element is plugged or screwed so that it can be replaced easily, which is necessary from time to time because of wear. In known devices, metallic contact elements also had to be renewed from time to time. As contact usually is only made at points and as, as a result thereof, the current density is locally very high, these contact elements also wear. Metal is also partially removed when the contact elements are being stripped.

In racks in dip tanks, one-sided current supply lines are also encountered in the form of a strut and a thrust bearing for example. With racks with one-sided abutment for printed circuit boards and with other one-sided clamps or clips, the mating contacting surface, i.e., the abutment, may also be elastic and electrically conductive.

During electroplating, the elastic contact elements are electroplated when they are exposed to the electrical field in the electrolyte. In this case, the contact means are periodically stripped for cleaning in order to preserve their elasticity. This can happen either by electrolytic or by chemical means. The elastic contact material is selected such that it is also stable when the corresponding stripping process is being carried out.

Springable current supply lines are preferred to electroplate molded goods such as fittings and other hollow ware on electroplating racks. These goods often are plastic parts the metallic surfaces of which are very sensitive to damage. The contact elements in accordance with the invention may also advantageously be used for this case of application.

---

Listing of numerals:

1 electric current supply line
2 level of bath
3 axle with support and transport wheels
4 mobile clamp part
5 stationary clamp part
6 work/work to be electroplated
7 plastic insulation
8 elastic contact element
9 elastic plastic insulation
10 clamp bow of the rack, mobile
11 clamp bow of the rack, stationary
12 rack carrier
13 rotating clamp-carrier
14 rotating clamp-bars
15 clamp spring
16 supporting frame
17 pin
18 projection on the clamp bow

---

What is claimed is:

1. An electrolytic treatment device for placing work to be electrolytically treated in electric contact, comprising contact carriers with contact elements for supplying current to the work, wherein at least the contact areas of the contact elements (8) which are configured to contact the work (6) are made from an elastic, electrically conductive material, and elastic non-conductive sheathing is arranged in the region surrounding the contact elements in such a way that the contact elements are prevented from being electrolytically treated when the work to be treated is pressed against the contact elements.

2. The device according to claim 1, wherein the contact carriers (4, 5, 10, 11) are configured to form clamps, tongs, clips, bows or springs with one or two mobile legs.

3. The device according to one of the claims 1 and 2, wherein at least one elastic, electrically conductive contact element (8) is positively engaged by being pressed into the contact carriers (4, 5, 10, 11).

4. The device according to one of the claims 1 and 2, wherein the elastic, electrically conductive material is applied to the contact carriers (4, 5, 10, 11) by vulcanization, by bonding by means of an electrically conductive adhesive, or by spraying in such a manner that it is tightly adherent and electrically conductive.

5. The device according to one of the claims 1 and 2, wherein the elastic, electrically conductive material is attached to the contact carriers (4, 5, 10, 11) by way of a joining technique that does not affect the elasticity of the contact elements.

6. The device according to one of the aforementioned claims 1 and 2, wherein the contact elements (8) are made from an elastic plastic containing electrically conductive fillers in high proportion.

7. The device according to claim 6, wherein the electrically conductive fillers are stable to electrolytic and/or chemical attack.

8. The device according to one of the claims 1 and 2, wherein the contact elements (8) are made from an elastic, electrically conductive, chemically and thermally stable, suitably formed metal wire fabric without plastic filling.

9. The device according to one of the aforementioned claims 1 and 2, wherein the contact element (8) is configured in such a manner that it is provided with good electric conducting properties substantially only in the region of the contact areas.

10. The device according to one of the aforementioned claims 1 and 2, wherein the contact carriers (4, 5, 10, 11) are provided with at least two supporting arms, the one supporting arm (5, 11) being provided, in the contacting region, with a pin (17) and the other supporting arm (4, 10) being provided, in the contacting region, with a bore into which the pin (17) can penetrate when electric contact is established between the contact element (8) and the work (6).

11. The device according to one of the aforementioned claims 1 and 2, wherein the contact carriers (10, 11) are arranged, together with the contact elements (8), on racks (14) serving to hold board-shaped work (6), at least one spring-mounted contact carrier (10) and at least one rigidly mounted contact carrier (11) being provided for holding the work (6), the spring-mounted contact carrier (10) pressing the work (6), by way of a first contact element (8), against a second contact element (8) provided on the rigidly mounted contact carrier (11).

12. A method of electrolytically treating a work comprising the step of placing said work in electric contact by way of contact elements arranged on contact carriers, said contact elements being made from an elastic, electrically conductive material and elastic non-conductive sheathing is arranged in the region surrounding the contact elements in such a way that the contact elements are prevented from being electrolytically treated when the work to be treated is pressed against the contact elements, wherein mechanical tolerances encountered with contact elements (8) that rest all over the surface of the work (6) are compensated by way of electrically conductive surfaces on the contact element in such a manner that electrolytic current is transmitted over the entire surface of the contact element (8).

13. The method according to claim 12, wherein the current is supplied to the work (6) by way of contact carriers (4, 5, 10, 11) configured to form clamps, tongs, clips, bows or springs with one or two mobile legs.

14. The method according to one of the claims 12 and 13, wherein the current is supplied to the work (6) by way of at least one elastic, electrically conductive contact element (8) positively press-fitted into the contact carriers (4, 5, 10, 11).

15. The method according to one of the claims 12 and 13, wherein the current is supplied to the work (6) by way of at least one contact element (8) that is made by vulcanizing, bonding by means of an electrically conductive adhesive or by spraying an elastic, electrically conductive material onto the contact carriers (4, 5, 10, 11) in such a manner that it is tightly adherent and electrically conductive.

16. The method according to one of the claims 12 and 13, wherein the current is supplied to the work (6) by way of at least one contact element (8) in which the elastic, electrically conductive material is fastened to the contact carriers (4, 5, 10, 11) by means of a joining technique that does not affect the elasticity of the contact elements.

17. The method according to one of the claims 12 and 13, wherein the current is supplied to the work (6) by way of at least one contact element (8), said contact element being made from an elastic plastic containing electrically conductive fillers in high proportion.

18. The method according to claim 17, wherein the materials selected for the electrically conductive fillers are stable to electrolytic and/or chemical attack.

19. The method according to one of the claims 12 and 13, wherein the current is supplied to the work (6) by way of at least one contact element (8) made from an 30 elastic, electrically conductive, chemically and thermally stable, suitably formed metal wire fabric without plastic filling.

20. The method according to one of the claims 12 and 13, wherein the current is supplied to the work (6) by way of at least one contact element (8) which is configured in such a manner that it is provided with good electric conductivity substantially only in the region of the contact areas.

21. The method according to one of the claims 12 and 13, wherein the current is supplied to the work (6) by way of contact carriers (4, 5, 10, 11), each being provided with at least two supporting arms, the one supporting arm (15, 11) of the one contact carrier (4, 5, 10, 11) being provided, in the contacting region, with a pin (17) and the other supporting arm (4, 10) being provided, in the contacting region, with a bore into which the pin (17) penetrates when electric contact is established between the contact element (8) and the work (6).

22. The method according to one of the claims 12 and 13, wherein the current is supplied to the work (6) by way of at least one contact element (8) arranged on contact carriers (10, 11), the contact carriers (10, 11) being arranged on racks (14) serving to hold the work (6), at least one spring-mounted contact carrier (10) and at least one rigidly mounted contact carrier (11) being furthermore provided for holding the board-shaped work (6), the spring-mounted contact carrier (10) pressing the work (6), by way of a first contact element (8), against a second contact element (8) provided on the rigidly mounted contact carrier (11).

23. An electrolytic treatment device for placing work to be electrolytically treated in electric contact, comprising contact carriers with contact elements for supplying current to the work, wherein at least the contact areas of the contact elements (8) are configured to contact the work (6) are made from an elastic, electrically conductive, chemically and thermally stable, suitably formed metal wire fabric without plastic filling and wherein elastic non-conductive sheathing is arranged in the region surrounding the contact elements in such a way that the contact elements are sealed from bath fluid when the work to be treated is pressed against the contact elements.

24. A method of electrolytically treating a work comprising the step of placing said work in electric contact by way of contact elements arranged on contact carriers, said contact elements being made from an elastic, electrically conductive, chemically and thermally stable, suitably formed metal wire fabric without plastic filling, wherein mechanical tolerances encountered with contact elements (8) that rest all over the surface of the work (6) are compensated by way of electrically conductive surfaces on at least one of the contact elements in such a manner that electrolytic current is transmitted over the entire surface of the contact element (8) and wherein elastic non-conductive sheathing is arranged in the region surrounding the contact elements in such a way that the contact elements are sealed from bath fluid when the work to be treated is pressed against the contact elements.

* * * * *

UNITED STATES PATENT AND TRADEMARK OFFICE
CERTIFICATE OF CORRECTION

PATENT NO. : 6,926,813 B2
DATED : August 9, 2005
INVENTOR(S) : Hubel

It is certified that error appears in the above-identified patent and that said Letters Patent is hereby corrected as shown below:

Column 12,
Line 18, replace "15" with -- 5 --.

Signed and Sealed this

Eighth Day of November, 2005

JON W. DUDAS
*Director of the United States Patent and Trademark Office*